(12) United States Patent
Nieddu et al.

(10) Patent No.: US 11,271,586 B2
(45) Date of Patent: Mar. 8, 2022

(54) ANALOG TO DIGITAL CONVERTERS FOR TEMPERATURE SENSORS OF VEHICLES

(71) Applicant: GM GLOBAL TECHNOLOGY OPERATIONS LLC, Detroit, MI (US)

(72) Inventors: Stefano Nieddu, Turin (IT); Simone Alpe, Turin (IT)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 165 days.

(21) Appl. No.: 16/747,071

(22) Filed: Jan. 20, 2020

(65) Prior Publication Data

US 2021/0226646 A1 Jul. 22, 2021

(51) Int. Cl.
| | | |
|---|---|---|
| *H03M 3/00* | (2006.01) | |
| *G01K 7/22* | (2006.01) | |
| *G01K 1/02* | (2021.01) | |
| *G01K 7/02* | (2021.01) | |
| *G01K 13/02* | (2021.01) | |
| *F01N 11/00* | (2006.01) | |
| *G01K 13/024* | (2021.01) | |

(52) U.S. Cl.
CPC ........... *H03M 3/494* (2013.01); *F01N 11/002* (2013.01); *F01N 11/005* (2013.01); *G01K 1/026* (2013.01); *G01K 7/02* (2013.01); *G01K 7/22* (2013.01); *G01K 13/02* (2013.01); *H03M 3/464* (2013.01); *G01K 13/024* (2021.01); *H03M 3/34* (2013.01); *H03M 3/43* (2013.01)

(58) Field of Classification Search
CPC ........ H03M 3/494; H03M 3/464; H03M 3/34; H03M 3/43; F01N 11/005; F01N 11/002; G01K 7/22; G01K 1/026; G01K 7/02; G01K 13/02; G01K 13/024
See application file for complete search history.

(56) References Cited

U.S. PATENT DOCUMENTS

| | | | | |
|---|---|---|---|---|
| 4,122,720 A | * | 10/1978 | Podl | G01K 1/026 340/449 |
| 6,202,406 B1 | * | 3/2001 | Griffin | F02P 5/1506 60/274 |
| 6,768,436 B1 | * | 7/2004 | Chuang | H03M 3/364 341/143 |

(Continued)

OTHER PUBLICATIONS

U.S. Appl. No. 16/747,058, filed Jan. 20, 2020, ALPE et al.

*Primary Examiner* — Nathaniel T Woodward
*Assistant Examiner* — Philip L Cotey

(57) ABSTRACT

A system includes: a first temperature sensor configured to measure a first temperature of exhaust at a first location of an exhaust system of a vehicle; a second temperature sensor configured to measure a second temperature of exhaust at a second location of the exhaust system of the vehicle; a first analog to digital (A/D) converter configured to receive a first analog signal from the first temperature sensor, to sample the first analog signal to produce first samples, and to generate first digital values corresponding to the first temperature based on the first samples, respectively; and a second A/D converter a configured to receive a second analog signal from the second temperature sensor, to sample the second analog signal to produce second samples, and to generate second digital values corresponding to the second temperature based on the second samples, respectively.

19 Claims, 7 Drawing Sheets

(56) References Cited

U.S. PATENT DOCUMENTS

| | | | |
|---|---|---|---|
| 7,059,769 B1* | 6/2006 | Potega | B60L 58/12 374/185 |
| 2002/0067770 A1* | 6/2002 | Wu | H03M 3/404 375/247 |
| 2007/0047616 A1* | 3/2007 | Izumiura | F02D 41/222 374/144 |
| 2014/0069081 A1* | 3/2014 | Tylutki | F01N 11/002 60/274 |
| 2016/0320249 A1* | 11/2016 | Reiman | G01K 7/04 |
| 2019/0049406 A1* | 2/2019 | Kamiya | F02D 41/2454 |
| 2020/0173863 A1* | 6/2020 | Gajdarus | G01K 7/02 |
| 2020/0366313 A1* | 11/2020 | Ng | H03M 1/1038 |
| 2021/0223807 A1* | 7/2021 | Alpe | G01K 7/22 |

\* cited by examiner

ANALOG TO DIGITAL CONVERTERS FOR TEMPERATURE SENSORS OF VEHICLES

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to temperature sensors of vehicles and more particularly to interface modules for temperature sensors of vehicles.

Air is drawn into an engine through an intake manifold. A throttle valve controls airflow into the engine. The air mixes with fuel from one or more fuel injectors to form an air/fuel mixture. The air/fuel mixture is combusted within one or more cylinders of the engine. Combustion of the air/fuel mixture generates torque.

Exhaust resulting from the combustion of the air/fuel mixture is expelled from the cylinders to an exhaust system. The exhaust may include particulate matter (PM) and gas. The exhaust gas includes nitrogen oxides (NOx), such as nitrogen oxide (NO) and nitrogen dioxide ($NO_2$). A treatment system reduces NOx and oxidizes PM in the exhaust.

The exhaust flows from the engine to an oxidation catalyst (OC). The OC removes hydrocarbons and/or carbon oxides from the exhaust. The exhaust flows from the OC to a selective catalytic reduction (SCR) catalyst. A dosing agent injector injects a dosing agent into the exhaust stream, upstream of the SCR catalyst. Ammonia ($NH_3$) provided by the dosing agent is absorbed by the SCR catalyst. Ammonia reacts with NOx in the exhaust passing the SCR catalyst.

SUMMARY

In a feature, a system includes: a first temperature sensor configured to measure a first temperature of exhaust at a first location of an exhaust system of a vehicle; a second temperature sensor configured to measure a second temperature of exhaust at a second location of the exhaust system of the vehicle; a first analog to digital (A/D) converter configured to receive a first analog signal from the first temperature sensor, to sample the first analog signal to produce first samples, and to generate first digital values corresponding to the first temperature based on the first samples, respectively; and a second A/D converter a configured to receive a second analog signal from the second temperature sensor, to sample the second analog signal to produce second samples, and to generate second digital values corresponding to the second temperature based on the second samples, respectively.

In further features, a third temperature sensor configured to measure a third temperature of exhaust at a third location of the exhaust system of the vehicle, and a third A/D converter configured to receive a third analog signal from the third temperature sensor, to sample the third analog signal to produce third samples, and to generate third digital values corresponding to the third temperature based on the third samples, respectively.

In further features, the first A/D converter includes: input amplifiers configured to receive the first analog signal from the first temperature sensor; an amplifier, integrator, and quantizer (AIQ) module configured to perform amplification, integration, and quantization based on outputs of the input amplifiers; and a decimation filter configured to generate the first digital values based on output from the AIQ module.

In further features, the first A/D converter includes: a first amplifier having a first input, a second input, and a first output, the first input connected to a first potential, and the first output connected to the second input; a first resistor connected between the first output and a first node; a second resistor connected between the first node and a first output of a first digital to analog (D/A) converter; the first D/A converter; a third resistor connected between the first node and a second node; a second amplifier having a third input, a fourth input, and a second output, the third input connected to a second potential, and the second output connected to the fourth input; a fourth resistor connected between the second output and a third node; a fifth resistor connected between the third node and a second output of a second D/A converter; the second D/A converter; a sixth resistor connected between the third node and a fourth node; a third amplifier having a fifth input connected to the second node, and a sixth input connected to the fourth node, and a third output; a flip-flop having a seventh input connected to the third output of the third amplifier, a non-inverted output connected to an eighth input of the first D/A converter, and an inverted output connected to a ninth input of the second D/A converter; and a decimation filter including an input connected to the non-inverted output of the flip-flop and configured to generate the first digital values based on signals received via the input.

In further features, a first switch configured to connect the first potential to the first input when a signal is in a first state and to connect the second potential to the first input when the signal is in a second state, and a second switch configured to connect the second potential to the third input when the signal is in the first state and to connect the first potential to the third input when the signal is in the second state.

In further features, a second flip-flop is configured to toggle the signal between the first and second states at a first frequency.

In further features, the decimation filter is configured to sample its input at a second frequency.

In further features, the first frequency is an even multiple of the second frequency.

In further features, an exclusive not OR (XNOR) gate includes a tenth input connected to the output of the flip-flop, an eleventh input connected to receive the signal from the second flop-flop, and an output connected to the input of the decimation filter.

In further features, a capacitor is connected between the second node and the fourth node.

In further features, an interface module is connected between the first temperature sensor and the first A/D converter and connected between the second temperature sensor and the second A/D converter.

In further features, the interface module includes a thermistor configured to measure a temperature of the interface module.

In further features, a fourth A/D converter is configured to receive a fourth analog signal from the thermistor, to sample the fourth analog signal to produce fourth samples, and to generate fourth digital values corresponding to the temperature of the interface module based on the fourth samples, respectively.

In further features, a correction module is configured to correct the first digital values corresponding to the first temperature based on the fourth digital values corresponding to the temperature of the interface module.

In further features, the correction module is further configured to correct the second digital values corresponding to the second temperature based on the fourth digital values corresponding to the temperature of the interface module.

In a feature, a method includes: by a first temperature sensor, measuring a first temperature of exhaust at a first location of an exhaust system of a vehicle; by a second temperature sensor, measuring a second temperature of exhaust at a second location of the exhaust system of the vehicle; by a first analog to digital (A/D) converter: receiving a first analog signal from the first temperature sensor; sampling the first analog signal to produce first samples; and generating first digital values corresponding to the first temperature based on the first samples, respectively; and by a second A/D converter: receiving a second analog signal from the second temperature sensor; sampling the second analog signal to produce second samples; and generating second digital values corresponding to the second temperature based on the second samples, respectively.

In further features, the method further includes: by a third temperature sensor, measuring a third temperature of exhaust at a third location of the exhaust system of the vehicle; and by a third A/D converter: receiving a third analog signal from the third temperature sensor; sampling the third analog signal to produce third samples; and generating third digital values corresponding to the third temperature based on the third samples, respectively.

In further features, the method further includes: by input amplifiers, amplifying the first analog signal from the first temperature sensor; by an amplification, integration, and quantization (AIQ) module, amplifying, integrating, and quantizing outputs of the input amplifiers; and generating the first digital values based on output from the AIQ module.

In further features, the method further includes: by a thermistor, measuring a temperature of an interface module; and by a fourth A/D converter: receiving a fourth analog signal from the thermistor; sampling the fourth analog signal to produce fourth samples; and generating fourth digital values corresponding to the temperature of the interface module based on the fourth samples, respectively.

In further features, the method further includes correcting the first digital values corresponding to the first temperature based on the fourth digital values corresponding to the temperature of the interface module.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

An engine combusts air and fuel within cylinders. Exhaust resulting from combustion is output from the engine to an exhaust system. Temperature sensors measure temperatures at locations, respectively, within the exhaust system. For example, a first temperature sensor may measure a temperature of exhaust near where the engine outputs exhaust to the exhaust system, a second temperature sensor may measure a temperature of exhaust downstream of an oxidation catalyst, and a third temperature sensor may measure a temperature of exhaust near an output of the exhaust system to atmosphere.

The temperature sensors are electrically connected by wire to an interface module, and the interface module is electrically connected to an engine control module by wire. The engine control module may adjust one or more operating parameters based on one or more temperatures measured by the sensors.

The wires connected to the temperature sensors could each be soldered to the interface module. However, if only one of the temperature sensors becomes faulty, all of the temperature sensors and the interface module would need to be replaced.

The present application involves an interface module that is individually connectable to and disconnectable from the temperature sensors. The interface module includes connectors configured to electrically connect to mating connectors soldered to the wires connected to the temperature sensors. With this configuration, if only one of the temperature sensors or the interface module becomes faulty, that temperature sensor or the interface module can be replaced without needing to replace all of the temperature sensors and the interface module.

The ECM could include one A/D converter and a multiplexer that controls which temperature sensor is input to the A/D converter. The output of the multiplexer could be subject to preconditioning (e.g., common mode input rejection) and amplification before being input to the A/D converter. Such systems, however, suffer from degradation and delay due to the multiplexing.

The ECM according to the present application includes A/D converters that convert analog signals from the temperature sensors into digital values corresponding to the temperatures measured by the temperature sensors, respectively. Having one A/D converter per sensor, and each A/D converter performing amplification, integration, and quantization, provides higher A/D conversion quality and better signal integrity.

Figure 1:
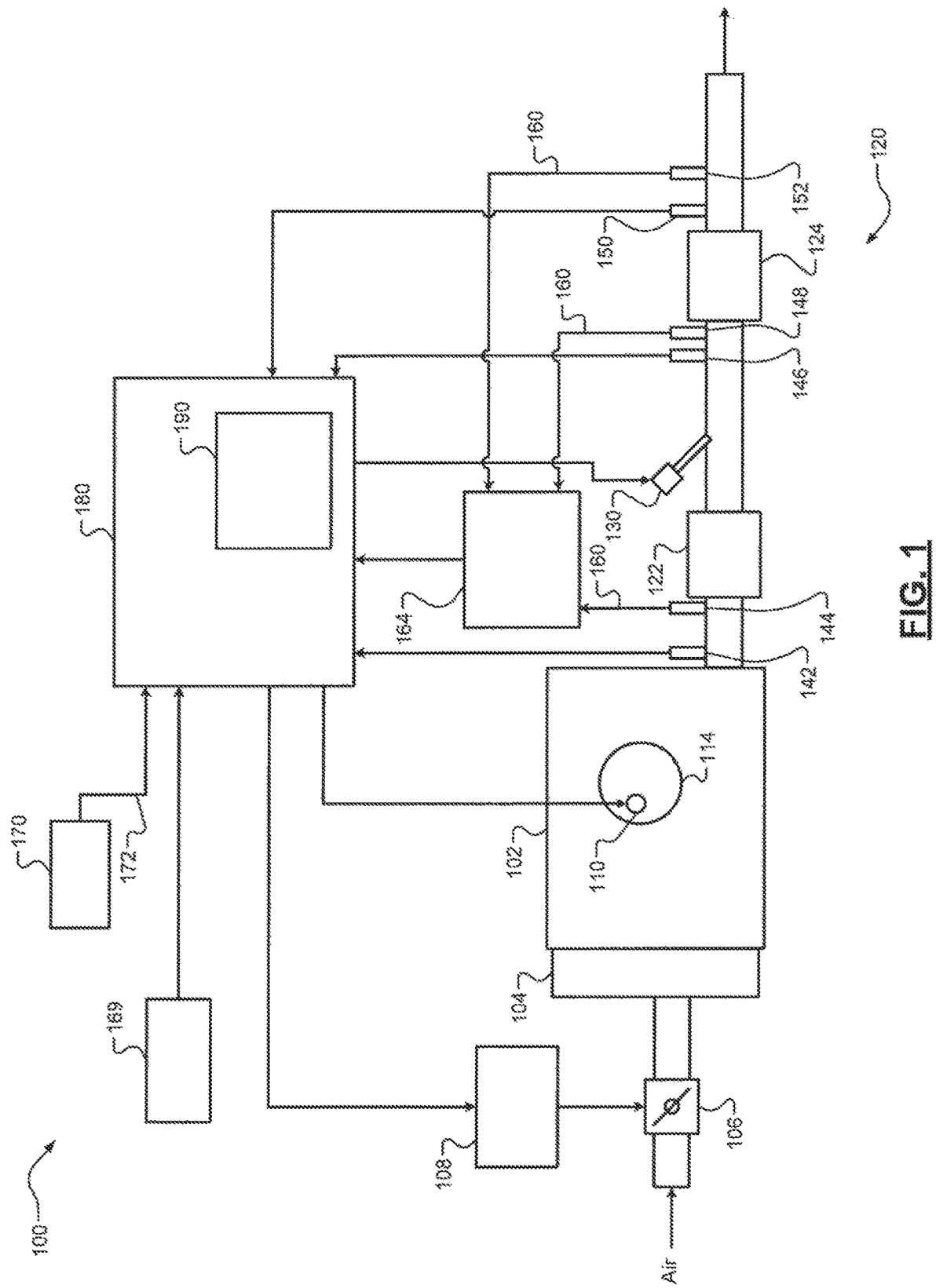
FIG. 1 is a functional block diagram of an example engine system.

Referring now to FIG. 1, a functional block diagram of an example engine system 100 is presented. An engine 102 may generate drive torque for a vehicle. While the engine 102 is shown and will be discussed as a diesel engine, the engine 102 may be another suitable type of engine, such as a gasoline engine or another suitable type of engine. One or more electric motors (or motor-generators) may additionally or alternatively generate drive torque.

Air is drawn into the engine 102 through an intake manifold 104. Airflow into the engine 102 may be varied using a throttle valve 106. A throttle actuator module 108 controls opening of the throttle valve 106. One or more fuel injectors, such as fuel injector 110, mix fuel with the air to form an air/fuel mixture. The air/fuel mixture is combusted within cylinders of the engine 102, such as cylinder 114. Although the engine 102 is depicted as including one cylinder, the engine 102 may include more than one cylinder. While not shown, the engine system 100 may include one or more boost devices, such as one or more turbochargers and/or superchargers.

Exhaust is expelled from the engine 102 to an exhaust system 120. The exhaust may include particulate matter (PM) and exhaust gas. The exhaust (gas) includes nitrogen oxides (NOx), such as nitrogen oxide (NO) and nitrogen dioxide ($NO_2$). The exhaust system 120 includes a treatment system that reduces the respective amounts of NOx and PM in the exhaust. While an example treatment system is provided, the present application is also applicable to treatment systems including more, fewer, and/or different treatment components.

The exhaust system 120 may include an oxidation catalyst (OC) 122 and a selective catalytic reduction (SCR) catalyst 124. The exhaust system 120 may also include a particulate filter (not shown). The exhaust flows from the engine 102 to the OC 122. For example only, the OC 122 may include a diesel oxidation catalyst (DOC). The exhaust flows from the OC 122 to the SCR catalyst 124. The exhaust may flow from the SCR catalyst 124 to the particulate filter. In various implementations, the particulate filter may be implemented in a common housing with the SCR catalyst 124. For example only, the particulate filter may include a diesel particulate filter (DPF).

A dosing agent injector 130 injects a dosing agent into the exhaust system 120 upstream of the SCR catalyst 124. For example only, the dosing agent injector 130 may inject the dosing agent at a location between the OC 122 and the SCR catalyst 124. The dosing agent includes urea ($CO(NH_2)_2$), ammonia ($NH_3$), and/or another suitable type of dosing agent that provides ammonia to the SCR catalyst 124. The dosing agent may also be referred to as an emissions fluid (EF), a diesel emissions fluid (DEF), or a reductant.

In implementations where the dosing agent includes urea, the urea reacts with the exhaust to produce ammonia, and ammonia is supplied to the SCR catalyst 124. The dosing agent may be diluted with water ($H_2O$) in various implementations. In implementations where the dosing agent is diluted with water, heat (e.g., from the exhaust) evaporates the water, and ammonia is supplied to the SCR catalyst 124. An example chemical equation that is illustrative of the production of ammonia from an example dosing agent solution is provided below.

$$HCNO + H_2O \rightarrow NH_3 + CO_2$$

The SCR catalyst 124 stores (i.e., absorbs) ammonia supplied by the dosing agent. For example only, the SCR catalyst 124 may include a vanadium catalyst, a zeolite catalyst, and/or another suitable type of SCR catalyst. An example chemical equation that is illustrative of ammonia absorption is provided below.

$$NH_3 + S \rightarrow NH_3(S)$$

The SCR catalyst 124 catalyzes a reaction between stored ammonia and NOx passing the SCR catalyst 124. The amount of ammonia stored by the SCR catalyst 124 may be referred to as current storage. The current storage may be expressed as a mass of ammonia (e.g., grams), a number of moles of ammonia, or another suitable measure of an amount of ammonia stored by the SCR catalyst 124.

NOx and ammonia react at a known rate, which may be referred to as a reaction rate. The reaction rate may be described by the equation:

$$RR = \frac{X Moles\ NH_3}{1\ Mole NOx},$$

where RR is the reaction rate and X varies depending on the amount of nitrogen dioxide ($NO_2$) in the exhaust. For example only, X may vary between from 1.0 and 1.333.

A percentage of NOx input to the SCR catalyst 124 that is removed from the exhaust via reaction with ammonia may be referred to as NOx conversion efficiency. The NOx conversion efficiency is directly related to the current storage of the SCR catalyst 124. For example only, the NOx conversion efficiency increases as the current storage of the SCR catalyst 124 increases.

The current storage of the SCR catalyst 124, however, is limited to a maximum amount of ammonia. This maximum amount of ammonia is referred to as the maximum storage capacity of the SCR catalyst 124. Maintaining the current storage of the SCR catalyst 124 at the maximum storage capacity ensures that a maximum amount of NOx is removed from the exhaust. In other words, maintaining the current storage at the maximum storage capacity may ensure that a greatest possible NOx conversion efficiency is achieved.

However, maintaining the current storage at or near the maximum storage capacity also increases the possibility that ammonia will be exhausted from the exhaust system 120. Exhausting ammonia from the exhaust system 120 may be referred to as ammonia slip. The increased possibility of ammonia slip may be attributable to the inverse relationship between the maximum storage capacity and the temperature of the SCR catalyst 124. More specifically, the maximum storage capacity decreases as the SCR temperature increases, and the decrease in the maximum storage capacity may cause ammonia to desorb (i.e., release) from the SCR catalyst 124. In other words, an increase in the SCR temperature causes a decrease in maximum storage capacity, and ammonia stored in excess of this decreased maximum storage capacity may desorb from the SCR catalyst 124. Thus, an increase in the SCR temperature may cause ammonia slip. An example chemical equation that is illustrative of ammonia desorption is provided below.

$$NH_3(S) \rightarrow NH_3 + S$$

All or a portion of the ammonia supplied by the dosing agent may oxidize before or after being absorbed by the SCR catalyst 124. For example, ammonia may react with oxygen in the exhaust to produce nitrogen ($N_2$) and water ($H_2O$). Ammonia oxidation may be triggered by, for example, heat. An example chemical equation that is illustrative of ammonia oxidation is provided below.

$$4NH_3 + 3O_2 \rightarrow 2N_2 + 6H_2O$$

The reaction of ammonia with NOx produces nitrogen and water. Other components of the exhaust, such as oxygen ($O_2$), may also be involved in the ammonia and NOx reaction. The example chemical equations provided below are illustrative of the reaction of ammonia and NOx.

$$4NH_3 + 4NO + O_2 \rightarrow 4N_2 + 6H_2O$$

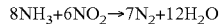

An upstream NOx sensor 142 may measure NOx in the exhaust at a location upstream of the OC 122. For example only, the upstream NOx sensor 142 may measure a mass flowrate of NOx (e.g., grams per second), a concentration of NOx (e.g., parts per million), or another suitable measure of the amount of NOx.

A first temperature sensor 144 measures a first temperature of the exhaust at a first location in the exhaust system 120, such as upstream of the OC 122. An oxygen sensor 146 measures oxygen ($O_2$) in the exhaust at a location between the OC 122 and the SCR catalyst 124. A second temperature sensor 148 measures a temperature of the exhaust at a second location in the exhaust system 120, such as between the OC 122 and the SCR catalyst 124. For example only, the oxygen sensor 146 and the second temperature sensor 148 may be located between where the dosing agent injector 130 injects the dosing agent and the SCR catalyst 124.

A downstream NOx sensor 150 may measure NOx in the exhaust at a location downstream of the SCR catalyst 124. For example only, the downstream NOx sensor 150 may measure a mass flowrate of NOx (e.g., grams per second), a concentration of NOx (e.g., parts per million), or another suitable measure of the amount of NOx.

A third temperature sensor 152 measures a third temperature of the exhaust at a third location in the exhaust system 120, such as downstream of the SCR catalyst 124. One or more other sensors 169 may additionally or alternatively be implemented. For example only, the other sensors 169 may include a mass air flowrate (MAF) sensor, an exhaust flow rate (EFR) sensor, an intake air temperature (IAT) sensor, a manifold absolute pressure (MAP) sensor, an engine speed (RPM) sensor, an exhaust pressure sensor, a cylinder pressure sensor, another oxygen sensor, and/or other suitable sensors.

A user initiates vehicle startup and shutdown events via an ignition system 170. For example only, the ignition system 170 may include one or more buttons, switches, and/or other devices that a user may actuate to command that the vehicle be turned ON and OFF. The ignition system 170 generates a vehicle ON/OFF signal 172 based on user inputs to the ignition system 170.

An engine control module (ECM) 180 controls the torque output of the engine 102. The ECM 180 may also control the engine 102 based on the vehicle ON/OFF signal 172. For example, the ECM 180 may initiate engine cranking to start the engine 102 when the vehicle ON signal 172 is received. The ECM 180 may disable the engine 102 when the vehicle OFF signal 172 is received.

The ECM 180 may include a dosing control module 190 that controls the injection of the dosing agent into the exhaust system 120. For example only, the dosing control module 190 may control the timing and rate of dosing agent injection. The dosing control module 190 controls the supply of ammonia to the SCR catalyst 124 and the current storage of the SCR catalyst 124 via controlling the injection of dosing agent.

The rate at which dosing agent is injected may be referred to as a dosing rate (e.g., grams per second), and the rate at which ammonia is supplied to the SCR catalyst 124 may be referred to as a supply rate (e.g., grams per second). The dosing control module 190 may determine a target supply rate, determine a target dosing rate to achieve the target supply rate, and control the injection of dosing agent at the target dosing rate. The dosing control module 190 may determine the target supply rate based on one or more of the first, second, and third temperatures measured using the first, second, and third exhaust temperature sensors 144, 148, and 152. While the example of three exhaust temperature sensors is provided, the present application is also applicable to additional temperature sensors.

The first, second, and third exhaust temperature sensors 144, 148, and 152 are connected via wires 160 to an interface module 164. Connectors at ends of the wires 160 connect to connectors on the interface module 164. This allows the temperature sensors 144, 148, and 152 to be individually disconnected from the interface module 164, for example, for replacement without having to replace the interface module 164 and other non-faulty temperature sensors. If the ends of the wires 160 were instead soldered to the interface module 164, the interface module 164 and all of the temperature sensors 144, 148, and 152 would need to be replaced in the event that a single one of the temperature sensors 144, 148, and 152 becomes faulty.

Figure 2:
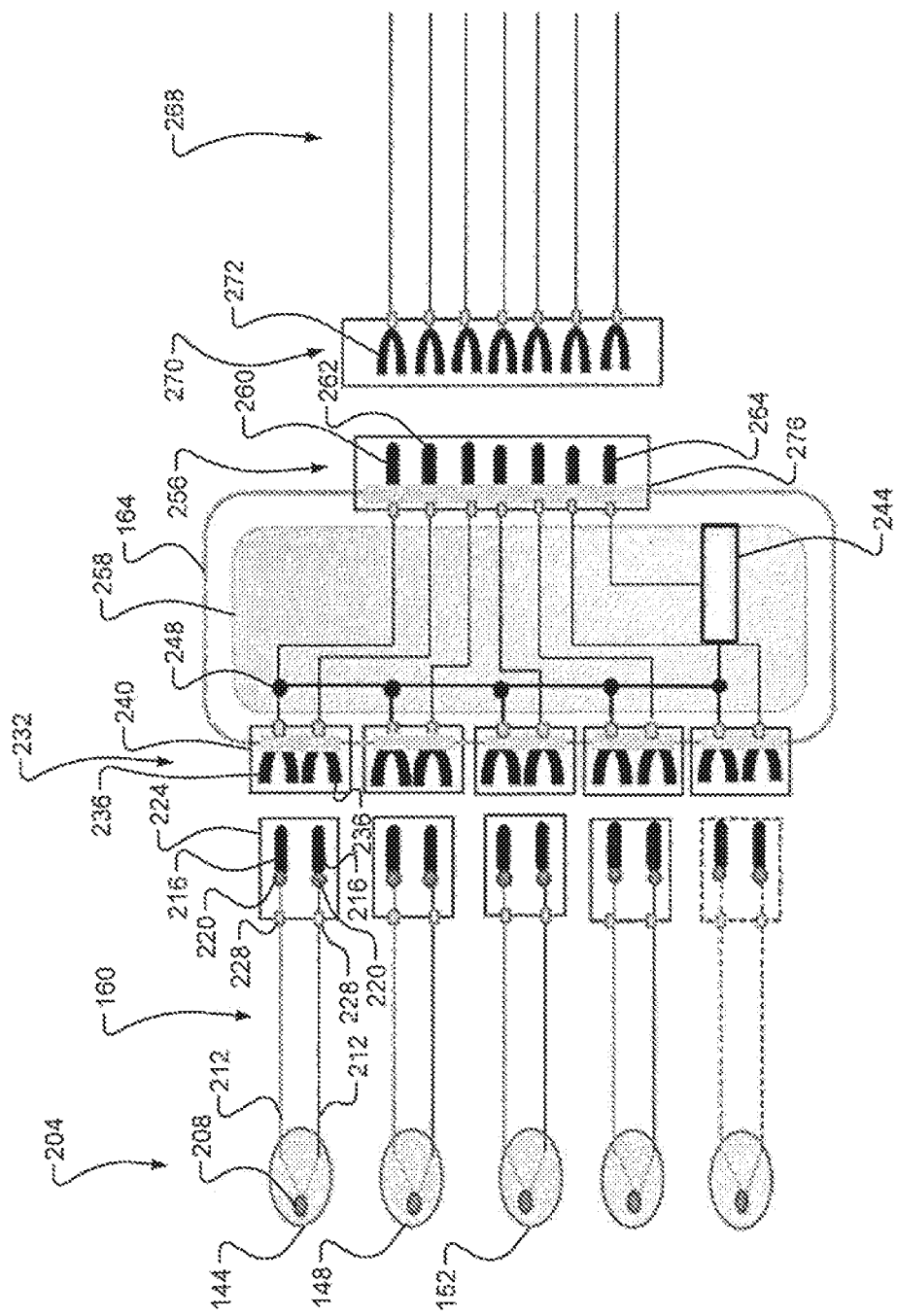
FIG. 2 is a schematic of an example implementation of an interface module.

FIG. 2 is a schematic of an example implementation of the interface module 164. A plurality (N) of temperature sensors 204 are connected to the interface module 164 via the wires 160. The wires 160 include an electrical conductor, such as an one or more electrically conductive wires within an electrical insulator. The interface module 164 is configured to be connected to N different temperature sensors by wire, where N is an integer greater than or equal to 3.

Each of the temperature sensors 204 includes a thermocouple. For example, the first temperature sensor 144 includes thermocouple 208. First ends of the wires 160 of each temperature sensor are connected to the thermocouple of that temperature sensor. For example, first ends of wires 212 are connected to the thermocouple 208.

Second ends of the wires 160 of each temperature sensor are connected to the connectors of that temperature sensor. For example, second ends of the wires 212 are electrically connected to connectors 216. The connectors (e.g., 216) of the temperature sensors are electrically conductive and may be, for example, male type electrical connectors as illustrated in the example of FIG. 2. Alternatively, the connectors (e.g., 216) may be female type electrical connectors. The second ends of the wires 212 are soldered to the connectors. For example, the second ends of the wires 212 are soldered to the connectors 216, as illustrated by 220.

Seals (e.g., watertight) prevent the connectors (e.g., 216) from being contacted by environmental elements, such as water, dirt, salt, etc. For example, seal 224 seals the connectors 216. The seals (e.g., 224) may be sealed to the wires 160 near the second ends, such as illustrated by 228.

The interface module 164 includes input connectors 232 configured to electrically connect to the connectors of the temperature sensors. For example, the interface module includes input connectors 236. In the example of FIG. 2, the connectors 216 connect to the input connectors 236. The input connectors (e.g., 236) are electrically conductive and may be, for example, female type electrical connectors as illustrated in the example of FIG. 2. Alternatively, the input connectors (e.g., 236) may be female type electrical connectors in the example of the connectors (e.g., 216) of the temperature sensors being male type electrical connectors.

Input seals (e.g., watertight) prevent the input connectors (e.g., 236) from being contacted by environmental elements, such as water, dirt, salt, etc. For example, input seal 240 seals the input connectors 236. The input seals (e.g., 240) may be sealed to the interface module 164.

The interface module 164 includes a pair of input connectors (a first input connector and a second input connector) for each temperature sensor, as illustrated in the example of FIG. 2. The first input connector of each pair of input connectors is connected in parallel and to a thermistor 244, as shown in the example of FIG. 2. For example, each of the first input connectors is connected to a node 248, and the thermistor 244 is connected to the node 248. The thermistor 244 is located on a thermally conductive component 258. The thermally conductive component 258 may be, for example, a thermally conductive plate (e.g., having a thermal conductivity greater than a predetermined value), a single or multi-layer printed circuit board (PCB). The thermal conductivity of the thermally conductive component 258 ensures that the thermally conductive component 258 has a uniform temperature across the entire thermally conductive component 258. This ensures that each of the cold junctions is approximately the same temperature. The thermistor 244 measures a temperature of the thermally conductive component 258 and generates an output accordingly. The thermally conductive component 258 is not electrically conductive as to allow electrical connections to be made across the thermally conductive component 258. The thermally conductive component 258 may be, for example, a dielectric material or another suitable type of material.

The interface module 164 also includes output connectors 256, such as output connector 260. The interface module 164 includes one first output connector for each pair of input connectors, one second output connector 264 for the thermistor 244, and one third output connector 262 for connection to the node 248. In the example of FIG. 2, the interface module 164 includes five pairs of input connectors and 5 first output connectors (the middle five of the output connectors 256 in the example of FIG. 5). The second input connector of each pair of input connectors is electrically connected to a respective one of the first output connectors. For example, the second (lower) input connector of the input connectors 236 is connected to the output connector 262. The output of the thermistor 244 is electrically connected to the second output connector 264. The third output connector 262 is electrically connected to the node 248.

The output connectors 256 are configured to electrically connect to connectors 270, such as connector 272, that are connected to first ends of wires 268. The output connectors 256 are electrically conductive and may be, for example, male type electrical connectors as illustrated in the example of FIG. 2. Alternatively, the output connectors 256 may be female type electrical connectors in the example of the connectors 270 being male type electrical connectors. Second ends of the wires 268 are connected to the ECM 180 (e.g., via connectors similar or identical to connectors 256 and 270).

One or more output seals (e.g., watertight), such as output seal 276, prevent the output connectors 256 from being contacted by environmental elements, such as water, dirt, salt, etc. The output seal(s) 276 may be sealed to the interface module 164.

Figure 3:
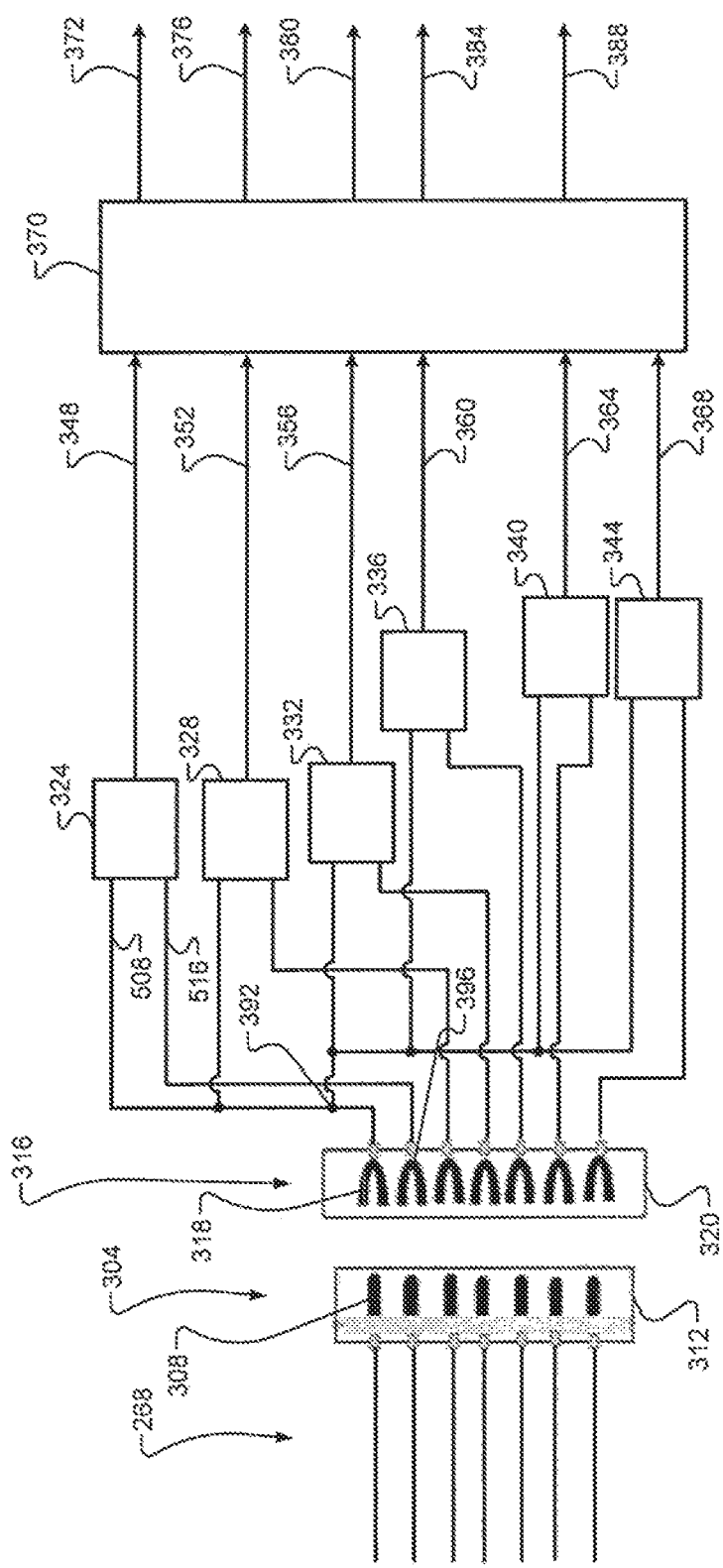
FIG. 3 is a functional block diagram of an example portion of an engine control module.

FIG. 3 is a functional block diagram of an example portion of the ECM 180. The second ends of the wires 268 are electrically connected to connectors 304, respectively, such as connector 308. The connectors 304 are electrically conductive and may be, for example, male type electrical connectors as illustrated in the example of FIG. 3. Alternatively, the connectors 304 may be female type electrical connectors. The second ends of the wires 268 are soldered to the connectors 304.

One or more seals (e.g., watertight) prevent the connectors 304 from being contacted by environmental elements, such as water, dirt, salt, etc. For example, seal 312 may seal the connectors 304. The seal(s) may be sealed to the wires 268 near the second ends.

The ECM 180 includes input connectors 316 configured to electrically connect to the connectors 304, respectively, For example, input connector 318 is configured to electrically connect to the connector 308. The input connectors 316 are electrically conductive and may be, for example, female type electrical connectors as illustrated in the example of FIG. 3. Alternatively, the input connectors 316 may be female type electrical connectors in the example of the connectors 304 being male type electrical connectors.

One or more input seals (e.g., watertight) prevent the input connectors 316 from being contacted by environmental elements, such as water, dirt, salt, etc. For example, input seal 320 seals the input connectors 316. The input seal(s) may be sealed to ECM 180.

The ECM 180 includes A/D converter for each of the temperature sensors 204 that can be (or are) connected to the interface module 164. For example, the ECM 180 includes a first A/D converter 324 for the first temperature sensor 144, a second A/D converter 328 for the second temperature sensor 148, a third A/D converter 332 for the third temperature sensor 152, and so on. The example of FIG. 3 also includes fourth and fifth A/D converters 336 and 340 for other ones of the temperature sensors 204 connected to the interface module 164. The ECM 180 also includes one A/D converter for the thermistor 244. For example, the ECM 180 includes sixth A/D converter 344 for the thermistor 244.

The A/D converters sample the analog inputs received via the wires 268 at a predetermined sampling rate. The A/D converters digitize the samples to produce digital values corresponding to the temperatures measured by connected temperature sensor or thermistor. For example, the first A/D converter 324 generates digital values corresponding to the first temperature 348 (T1) measured by the first temperature sensor 144. The second A/D converter 328 generates digital values corresponding to the second temperature 352 (T2) measured by the second temperature sensor 148. The third A/D converter 332 generates digital values corresponding to the third temperature 356 (T3) measured by the third temperature sensor 152. The fourth A/D converter 336 generates digital values corresponding to a fourth temperature 360 (T4) measured by a fourth temperature sensor. The fifth A/D converter 340 generates digital values corresponding to a fifth temperature 364 (T5) measured by a fifth temperature sensor. The sixth A/D converter 344 generates digital values corresponding to a temperature 368 (Ttherm) measured by the thermistor 244.

The ECM 180 may include a correction module 370 that corrects one or more of the first-fifth temperatures 348-364 based on the temperature 368 measured by the thermistor 244. The correction module 370 may, for example, determine a correction value for the first-fifth temperatures 348-364 using a lookup table or an equation that relates values of the temperature 368 to correction values. The correction module 370 may correct the first-fifth temperatures 348-364, for example, by multiplying or adding the determined correction value to the first-fifth temperatures 348-364 to produce adjusted first, second, third, fourth, and fifth temperatures 372, 376, 380, 384, and 388, respectively.

The ECM 180 may adjust one or more operating parameters (via associated actuators) based on one or more of the adjusted first-fifth temperatures 372-388. For example, the dosing control module 190 may adjust injection by the dosing agent injector 130 based on one or more of the adjusted first-fifth temperatures 372-388. Additionally or alternatively, the dosing control module 190 may adjust injection by the dosing agent injector 130 based on one or more of the first-fifth temperatures 348-364. Additionally or alternatively, the ECM 180 may adjust one or more other operating parameters based on one or more of the adjusted first-fifth temperatures 372-388 and/or one or more of the first-fifth temperatures 348-364.

One end (input) of each of the A/D converters is connected in parallel and to the connector 308. The connector 308 is connected to the output connector 260 by one of the wires 268. As shown in FIG. 2, the output connector 260 is connected to the node 248, which is connected to each of first input connectors if the pairs of input connectors 232 and the thermistor 244.

For example, one end of each of the A/D converters is electrically connected to node 392, which is electrically connected to the connector 308. The other end (input) of each of the A/D converters is electrically connected to another one of the input connectors 316 as to be connected to the associated one of the temperature sensors 204 or the thermistor 244. For example, the other end of the A/D converter 324 is connected to input connector 396 as shown in FIG. 3. The input connector 396 is connected to the first temperature sensor 144 as discussed above and as shown in FIG. 2.

Figure 4:
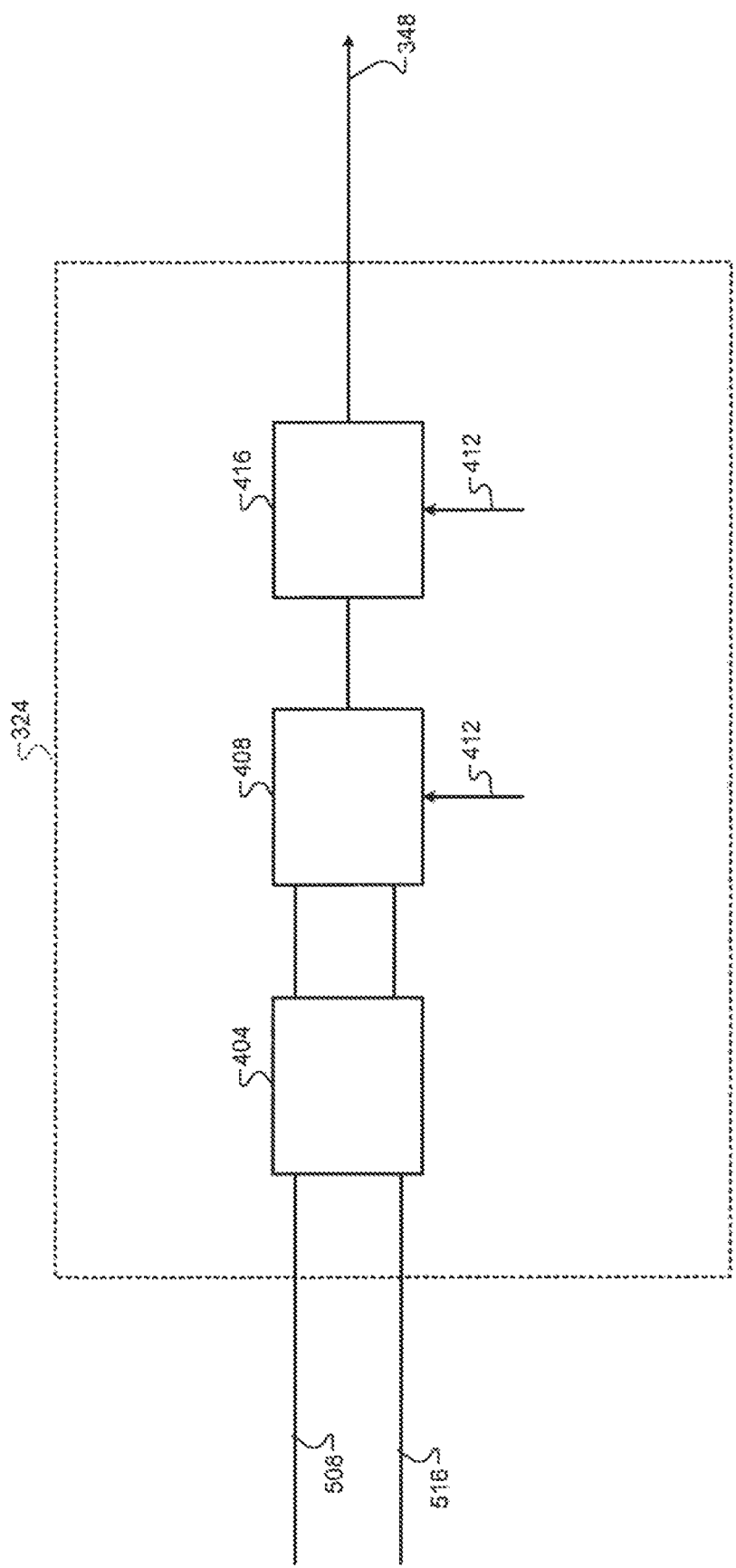
FIG. 4 is a functional block diagram of an example implementation of an analog to digital converter.

FIG. 4 is a functional block diagram of an example implementation of the A/D converter 324. One, more than one, or all of the other A/D converters 324 of the ECM 180 may be identical to the A/D converter 324.

The A/D converter 324 includes input amplifiers 404, such as differential amplifiers. The input amplifiers 404 provide outputs to an integrated amplification integration quantization (AIQ) module 408. The AIQ module 408 performs amplification, integration, and quantization based on the outputs of the input amplifiers 404 at a clock frequency of a clock signal (f clock) 412.

A decimation filter 416 samples its input at a filter output sampling frequency (fosr) and digitizes the samples to produce the first temperature 348. The decimation filter 416 updates the first temperature 348 at the clock frequency.

Figure 5:
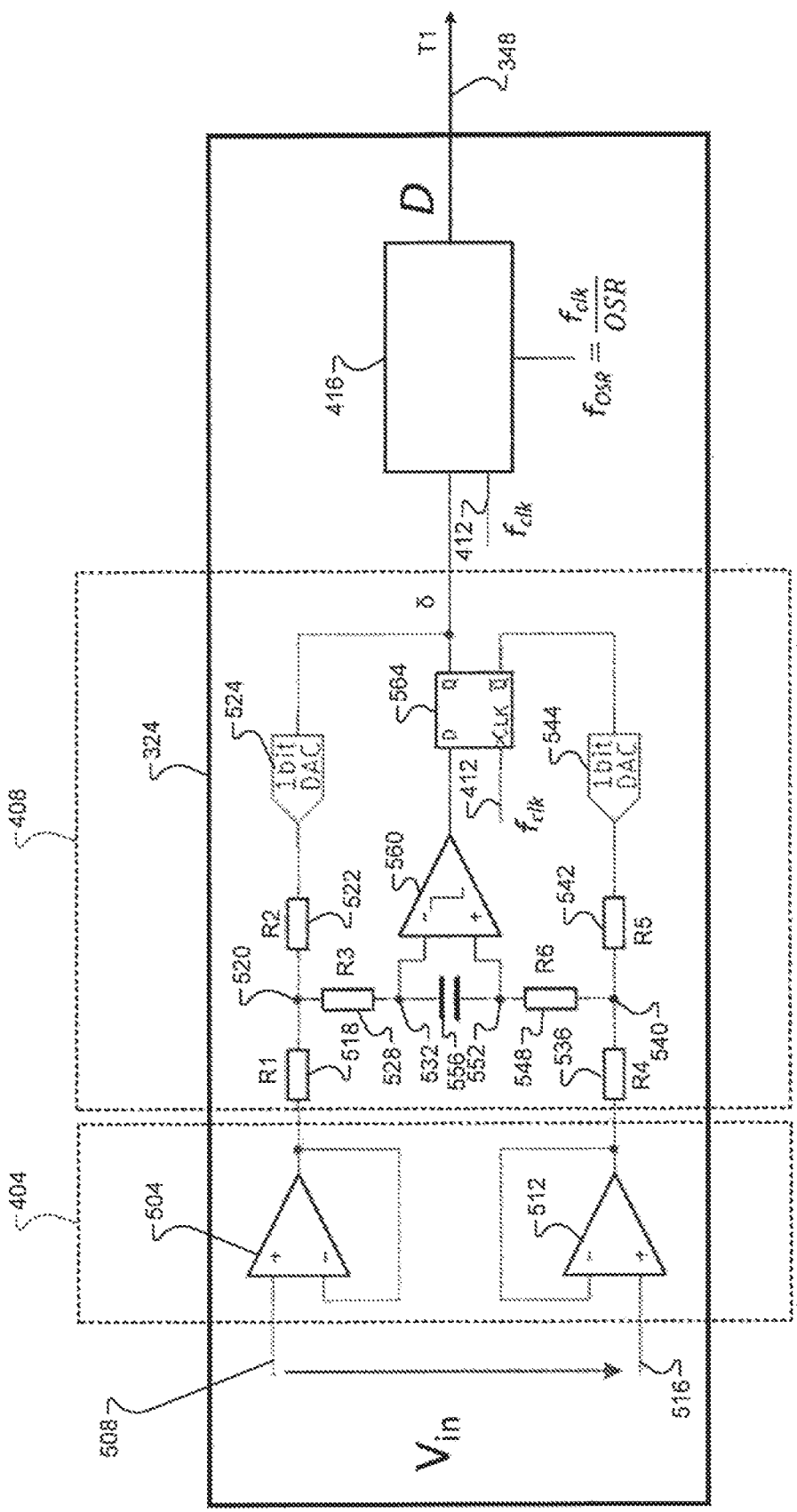
FIG. 5 is a schematic of an example implementation of an analog to digital converter.

FIG. 5 is a schematic of an example implementation of the A/D converter 324 of FIG. 4. A first differential amplifier 504 includes a positive input (+) and a negative input (−). The positive input is connected to the node 392 via a first electrical conductor 508, such as a wire or a trace. The negative input is connected to the output of the first differential amplifier 504.

A second differential amplifier 512 includes a positive input (+) and a negative input (−). The positive input is connected to the input connector 396 via a second electrical conductor 516, such as a wire or a trace. The negative input is connected to the output of the second differential amplifier 512. The reference potentials on the first and second electrical conductors 508 and 516 form an input voltage (Vin).

A first resistor (R1) 518 is connected between the output of the first differential amplifier 504 and a first node 520. A second resistor (R2) 522 is connected between an output of a 1 bit digital to analog converter (DAC) 524 and the first node 520. A third resistor (R3) 528 is connected between the first node 520 and a second node 532. The first and second resistors 518 and 522 form an amplifier having an amplification factor of G=R2/R1, where R2 is the resistance of the second resistor 522, and R1 is the resistance of the first resistor 518.

A fourth resistor (R4) 536 is connected between the output of the second differential amplifier 512 and a third node 540. A fifth resistor (R5) 542 is connected between an output of a 1 bit DAC 544 and the third node 540. A sixth resistor (R6) 548 is connected between the third node 540 and a fourth node 552. The resistances of the fourth, fifth, and sixth resistors 536, 542, and 548 may be equal to the resistances of the first, second, and third resistors 518, 522, and 528. The fourth and fifth resistors 536 and 542 form an amplifier (of the AIQ module 408) having an amplification factor of G=R5/R4, where R5 is the resistance of the fifth resistor 542, and R4 is the resistance of the fourth resistor 536.

A capacitor 556 is connected between the second node 532 and the fourth node 552. A positive input (+) of an amplifier 560 is connected to the fourth node 552. A negative output (−) of the amplifier 560 is connected to the second node 532. In this manner, an input voltage (Vd) is input to the amplifier 560.

An output of the amplifier 560 is connected to the D input of a D (type) flip-flop 564. The (non-inverted) Q output of the D flip-flop 564 is connected to the input of the 1 bit DAC 524. The (inverted) $\overline{Q}$ output of the D flip-flop 564 is connected to the input of the 1 bit DAC 544. The $\overline{Q}$ output of the D flip-flop 564 has the opposite state of the Q output (δ) of the D flip-flop 564. The D flip-flop 564 quantizes the output of the amplifier 560 at the clock frequency (fclk) of the clock signal. The 1 bit DACs 524 and 544 provide closed-loop regulation of the delta sigma modulator of the A/D converter 324. The amplifier 560 and the D flip-flop 564 form a quantizer of the AIQ module 408.

The Q output of the D flip-flop 564 is also connected to an input of the decimation filter 416. The decimation filter 416 digitizes the input to produce the (digital) first temperature 348. The decimation filter 416 digitizes the input at the clock frequency (fclk) of the clock signal.

Figure 6:
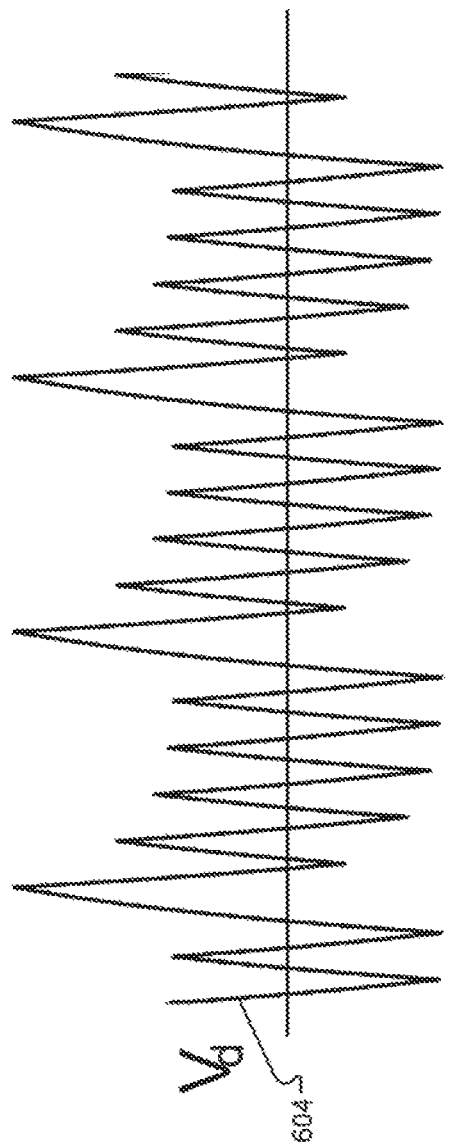
FIG. 6 includes an example graph of an input voltage over time.
Figure 7:
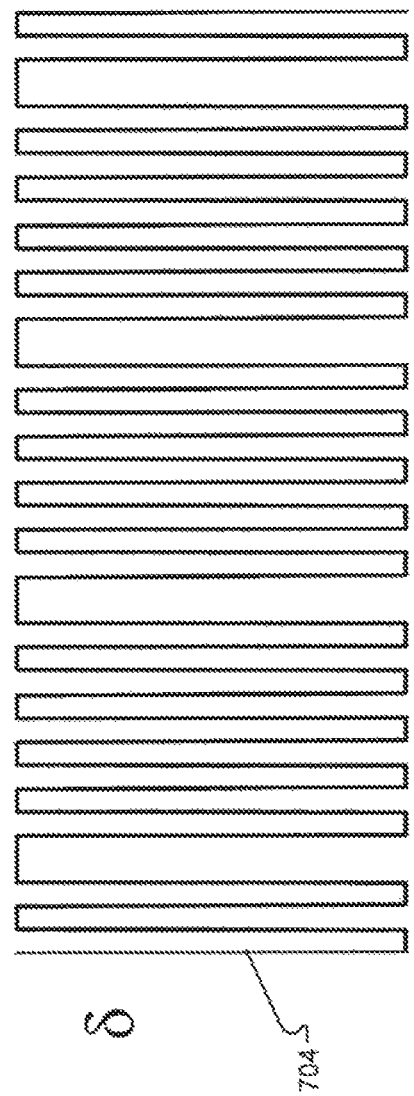
FIG. 7 includes an example graph of an output of a D flop-flop of a quantizer resulting from the input voltage of FIG. 6.

FIG. 6 includes an example graph of input voltage (Vd) 604 to the amplifier 560 over time. FIG. 7 includes an example graph of the (non-inverted, Q) output (δ) 704 of the D flop-flop 564 resulting from the input voltage 604 of FIG. 6.

The transfer function for the integration performed by the AIQ module 408 can be expressed by the following equations $$\frac{k}{s\tau + 1} \cong \frac{k}{s\tau}$$

at the clock frequency (fclk) of the clock signal, $$k = \frac{R1}{R2 + R1},$$

and $$\tau = 2(R1//R2+R3)*C,$$

where R1 is the resistance of the first (and fourth) resistor 518, R2 is the resistance of the second (and fifth) resistor 522, R3 is the resistance of the third (and sixth) resistor 528, and C is the capacitance of the capacitor 556.

The input voltage (Vd) can be described by the following equations $$Vd = [Vin*G - (2\delta - 1)*Vref]*\frac{k}{s\tau + 1}$$

at the clock frequency (fclk) of the clock signal, and $$Vd = [Vin*G - (2\delta - 1)*Vref] * \frac{k}{s\tau},$$

where Vref is a reference voltage (e.g., equal to δ).

The output of the decimation filter 416 (D) can be described by the following equation $$D = \frac{1}{2}\left[\frac{Vin*G}{Vref} + 1\right].$$

The active component offsets and bias currents may introduce a global offset error ΔD. The resistor matching errors εp and εn may introduce a global gain error ε. Additional increment of the offset error ΔD may be introduced by the input common mode propagation in the case of εp not being equal to εn.

Figure 8:
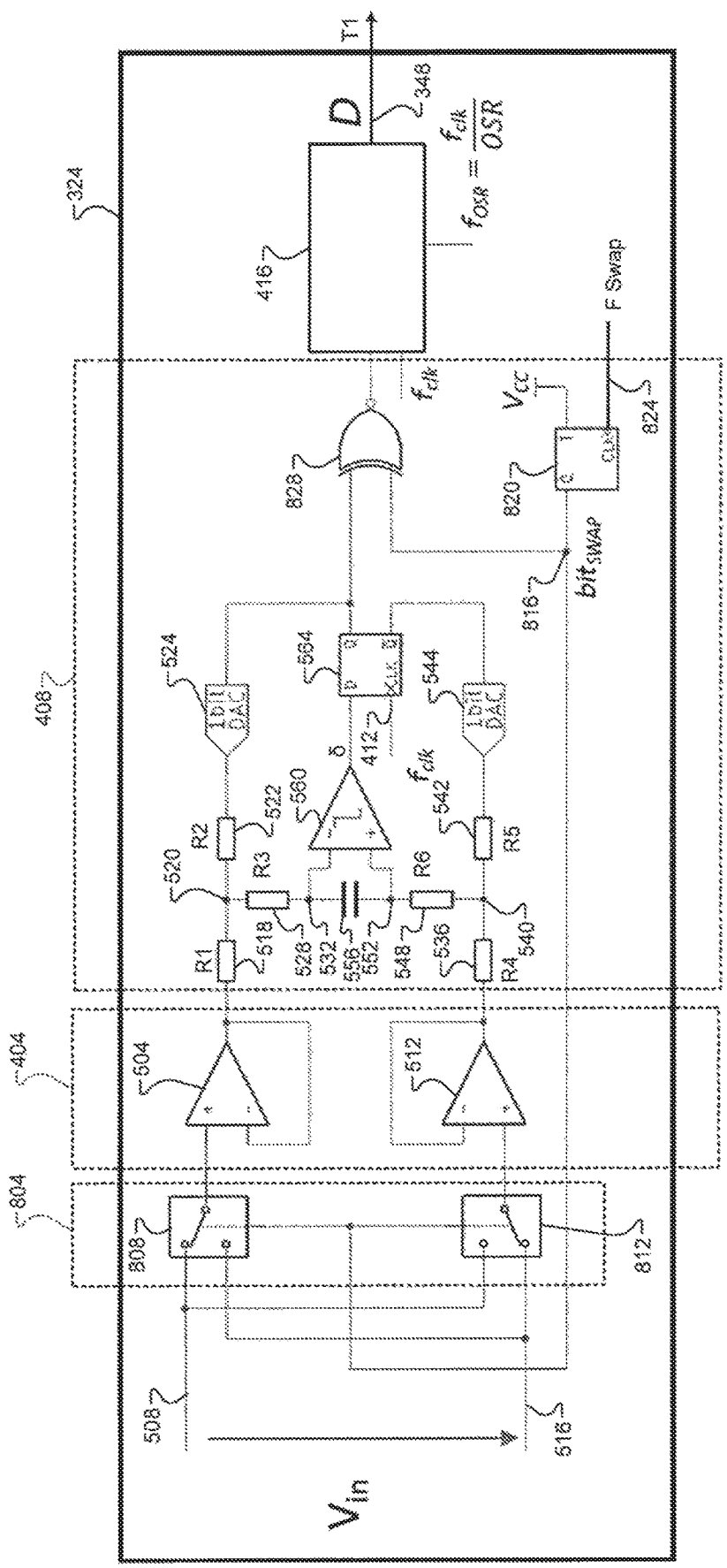
FIG. 8 is a schematic of an example implementation of the analog to digital converter of FIG. 5.

FIG. 8 is a schematic of an example implementation of the A/D converter 324 of FIG. 6 with additional components to compensate for the offset error ΔD. A two channel multiplexer 804 may toggle the polarity of the input voltage provided to the input amplifiers 404. For example, a first switch 808 includes two inputs and one output. A second switch 812 includes two inputs and one output. A first input of the first switch 808 is connected to the first conductor 508. A second input of the first switch 808 is connected to the second conductor 516. A first input of the second switch 812 is connected to the first conductor 508. A second input of the second switch 812 is connected to the second conductor 516. The output of the first switch 808 is connected to the positive input of the first differential amplifier 504. The output of the second switch 812 is connected to the positive input of the second differential amplifier 512.

The state of a bit swap signal 816 controls the first and second switches 808 and 812. When the bit swap signal 816 is in a first state (e.g., +voltage, VCC, logic 1), the first switch 808 connects its first input to its output. When the bit swap signal 816 is in the first state, the second switch 812 connects its second input to its output. When the bit swap signal 816 is in a second state (e.g., 0 Volts, logic 0), the first switch 808 connects its second input to its output. When the bit swap signal 816 is in the second state, the second switch 812 connects its first input to its output.

A flip-flop 820 toggles the bit swap signal 816 back and forth between the first state and the second state at a bit swap frequency of a bit swap signal 824. clock frequency of the clock signal 412. The bit swap frequency may be expressed as 2*k*fclk/OSR, where OSR is a one shot rising (OSR) frequency of a one-shot circuit. OSR dictates a filter output sampling frequency fosr of the decimation filter 416. The filter output sampling frequency fosr of the decimation filter 416 can be expressed as fclk/OSR. The bit swap frequency (fswap) is an even multiple of the decimation filter output sampling frequency fosr.

A two input exclusive not OR (XNOR) gate 828 includes a first input and a second input. The first input of the XNOR gate 828 is connected to the (non-inverted) Q output of the D flip-flop 564. The second input of the XNOR gate 828 is connected to the bit swap signal 816. The output of the XNOR gate 828 is input to the decimation filter 416.

In the example of FIG. 8, errors due to input signal common-mode residual, active component offset, and bias current, and the offset error ΔD are cancelled or minimized via the toggling of the bit swap signal 816 at the bit swap frequency. When the bit swap signal is in the first state (e.g., logic 1), the decimation filter output sampled at the decimation filter output sampling frequency fosr can be expressed as:

$$D = \frac{1}{2}*\left[\frac{Vin}{Vref}*G*(1+\varepsilon)+1\right] - \Delta D.$$

When the bit swap signal is in the second state (e.g., logic 0), the decimation filter output sampled at the decimation filter output sampling frequency fosr can be expressed as:

$$D = \frac{1}{2}*\left[\frac{Vin}{Vref}*G*(1+\varepsilon)+1\right] + \Delta D.$$

Toggling the bit swap signal 816 back and forth (from the first state to the second state and vice versa) at the bit swap frequency (which is an even multiple of the decimation filter output sampling frequency fosr) compensates for the offset error ΔD such that decimation filter output (D) sampled at the decimation filter output sampling frequency fosr can be expressed as:

$$D = \frac{1}{2}*\left[\frac{Vin}{Vref}*G*(1+\varepsilon)+1\right].$$

The examples of FIGS. 4, 5, and 8 reduce complexity relative to A/D converters having separate A, I, and Q components. The examples of FIGS. 4, 5, and 8 also reduce piece cost of the A/D converter relative to A/D converters having separate A, I, and Q components. The examples of FIGS. 4, 5, and 8 also have a faster response time than A/D converters having separate A, I, and Q components.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A system comprising:
a first temperature sensor configured to measure a first temperature of exhaust at a first location of an exhaust system of a vehicle;
a second temperature sensor configured to measure a second temperature of exhaust at a second location of the exhaust system of the vehicle;
a first analog to digital (A/D) converter configured to receive a first analog signal from the first temperature sensor, to sample the first analog signal to produce first samples, and to generate first digital values corresponding to the first temperature based on the first samples, respectively;
a second A/D converter a configured to receive a second analog signal from the second temperature sensor, to sample the second analog signal to produce second samples, and to generate second digital values corresponding to the second temperature based on the second samples, respectively; and an interface module connected between the first temperature sensor and the first A/D converter and connected between the second temperature sensor and the second A/D converter,
wherein the interface module includes a thermistor configured to measure a temperature of the interface module for correction of the first digital values.

2. The system of claim 1 further comprising:
a third temperature sensor configured to measure a third temperature of exhaust at a third location of the exhaust system of the vehicle; and
a third A/D converter configured to receive a third analog signal from the third temperature sensor, to sample the third analog signal to produce third samples, and to generate third digital values corresponding to the third temperature based on the third samples, respectively.

3. The system of claim 1 wherein the first A/D converter includes:
input amplifiers configured to receive the first analog signal from the first temperature sensor;
an amplifier, integrator, and quantizer (AIQ) module configured to perform amplification, integration, and quantization based on outputs of the input amplifiers; and
a decimation filter configured to generate the first digital values based on output from the AIQ module.

4. The system of claim 1 wherein the first A/D converter includes:
a first amplifier having a first input, a second input, and a first output, the first input connected to a first potential, and the first output connected to the second input;
a first resistor connected between the first output and a first node;
a second resistor connected between the first node and a first output of a first digital to analog (D/A) converter;
the first D/A converter;
a third resistor connected between the first node and a second node;
a second amplifier having a third input, a fourth input, and a second output, the third input connected to a second potential, and the second output connected to the fourth input;
a fourth resistor connected between the second output and a third node;
a fifth resistor connected between the third node and a second output of a second D/A converter;
the second D/A converter;
a sixth resistor connected between the third node and a fourth node;
a third amplifier having a fifth input connected to the second node, and a sixth input connected to the fourth node, and a third output;
a flip-flop having a seventh input connected to the third output of the third amplifier, a non-inverted output connected to an eighth input of the first D/A converter, and an inverted output connected to a ninth input of the second D/A converter; and
a decimation filter including an input connected to the non-inverted output of the flip-flop and configured to generate the first digital values based on signals received via the input.

5. The system of claim 4 further comprising:
a first switch configured to connect the first potential to the first input when a signal is in a first state and to connect the second potential to the first input when the signal is in a second state; and
a second switch configured to connect the second potential to the third input when the signal is in the first state and to connect the first potential to the third input when the signal is in the second state.

6. The system of claim 5 further comprising a second flip-flop configured to toggle the signal between the first and second states at a first frequency.

7. The system of claim 6 wherein the decimation filter is configured to sample its input at a second frequency.

8. The system of claim 7 wherein the first frequency is an even multiple of the second frequency.

9. The system of claim 6 further comprising an exclusive not OR (XNOR) gate including a tenth input connected to the output of the flip-flop, an eleventh input connected to receive the signal from the second flop-flop, and an output connected to the input of the decimation filter.

10. The system of claim 4 further comprising a capacitor connected between the second node and the fourth node.

11. The system of claim 1 further comprising a fourth A/D converter configured to receive a fourth analog signal from the thermistor, to sample the fourth analog signal to produce fourth samples, and to generate fourth digital values corresponding to the temperature of the interface module based on the fourth samples, respectively.

12. The system of claim 11 further comprising a correction module configured to correct the first digital values corresponding to the first temperature based on the fourth digital values corresponding to the temperature of the interface module.

13. The system of claim 12 wherein the correction module is further configured to correct the second digital values corresponding to the second temperature based on the fourth digital values corresponding to the temperature of the interface module.

14. A method comprising:
by a first temperature sensor, measuring a first temperature of exhaust at a first location of an exhaust system of a vehicle;
by a second temperature sensor, measuring a second temperature of exhaust at a second location of the exhaust system of the vehicle;
by a first analog to digital (A/D) converter:
receiving a first analog signal from the first temperature sensor;
sampling the first analog signal to produce first samples; and
generating first digital values corresponding to the first temperature based on the first samples, respectively;
by a second A/D converter:
receiving a second analog signal from the second temperature sensor;
sampling the second analog signal to produce second samples; and
generating second digital values corresponding to the second temperature based on the second samples, respectively; and
by a thermistor of an interface module, the interface module connected between the first temperature sensor and the first A/D converter and connected between the second temperature sensor and the second A/D converter, measuring a temperature of the interface module for correction of the first digital values.

15. The method of claim 14 further comprising:
by a third temperature sensor, measuring a third temperature of exhaust at a third location of the exhaust system of the vehicle; and
by a third A/D converter:

receiving a third analog signal from the third temperature sensor;

sampling the third analog signal to produce third samples; and generating third digital values corresponding to the third temperature based on the third samples, respectively.

16. The method of claim 14 further comprising:

by input amplifiers, amplifying the first analog signal from the first temperature sensor;

by an amplification, integration, and quantization (AIQ) module, amplifying, integrating, and quantizing outputs of the input amplifiers; and generating the first digital values based on output from the AIQ module.

17. The method of claim 14 further comprising:

by a fourth A/D converter:

receiving a fourth analog signal from the thermistor;

sampling the fourth analog signal to produce fourth samples; and generating fourth digital values corresponding to the temperature of the interface module based on the fourth samples, respectively.

18. The method of claim 17 further comprising correcting the first digital values corresponding to the first temperature based on the fourth digital values corresponding to the temperature of the interface module.

19. A system comprising:

a first temperature sensor configured to measure a first temperature of exhaust at a first location of an exhaust system of a vehicle;

a second temperature sensor configured to measure a second temperature of exhaust at a second location of the exhaust system of the vehicle;

a first analog to digital (A/D) converter configured to receive a first analog signal from the first temperature sensor, to sample the first analog signal to produce first samples, and to generate first digital values corresponding to the first temperature based on the first samples, respectively;

a second A/D converter a configured to receive a second analog signal from the second temperature sensor, to sample the second analog signal to produce second samples, and to generate second digital values corresponding to the second temperature based on the second samples, respectively, wherein the first A/D converter includes:

a first amplifier having a first input, a second input, and a first output, the first input connected to a first potential, and the first output connected to the second input;

a first resistor connected between the first output and a first node;

a second resistor connected between the first node and a first output of a first digital to analog (D/A) converter;

the first D/A converter;

a third resistor connected between the first node and a second node;

a second amplifier having a third input, a fourth input, and a second output, the third input connected to a second potential, and the second output connected to the fourth input;

a fourth resistor connected between the second output and a third node;

a fifth resistor connected between the third node and a second output of a second D/A converter;

the second D/A converter;

a sixth resistor connected between the third node and a fourth node;

a third amplifier having a fifth input connected to the second node, and a sixth input connected to the fourth node, and a third output;

a flip-flop having a seventh input connected to the third output of the third amplifier, a non-inverted output connected to an eighth input of the first D/A converter, and an inverted output connected to a ninth input of the second D/A converter; and a decimation filter including an input connected to the non-inverted output of the flip-flop and configured to generate the first digital values based on signals received via the input.

* * * * *